(12) United States Patent
Genda et al.

(10) Patent No.: US 11,433,487 B2
(45) Date of Patent: Sep. 6, 2022

(54) METHOD OF PROCESSING WORKPIECE (71) Applicant: DISCO CORPORATION, Tokyo (JP)

(72) Inventors: Satoshi Genda, Tokyo (JP); Andy Sher, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 448 days.

(21) Appl. No.: 16/733,607

(22) Filed: Jan. 3, 2020

(65) Prior Publication Data
US 2020/0215649 A1 Jul. 9, 2020

(30) Foreign Application Priority Data
Jan. 7, 2019 (JP) .............................. JP2019-000690

(51) Int. Cl.
| | | |
|---|---|---|
| H01L 21/00 | (2006.01) |
| B23K 26/53 | (2014.01) |
| B23K 26/03 | (2006.01) |
| B23K 26/06 | (2014.01) |
| H01L 21/78 | (2006.01) |
| H01L 21/683 | (2006.01) |
| B23K 101/40 | (2006.01) |

(52) U.S. Cl.
CPC ............ *B23K 26/53* (2015.10); *B23K 26/032* (2013.01); *B23K 26/0661* (2013.01); *B23K 26/0665* (2013.01); *H01L 21/6836* (2013.01); *H01L 21/78* (2013.01); *B23K 2101/40* (2018.08)

(58) Field of Classification Search
CPC combination set(s) only.
See application file for complete search history.

(56) References Cited

U.S. PATENT DOCUMENTS

| | | | | |
|---|---|---|---|---|
| 2004/0161940 A1* | 8/2004 | Daii | .................... | H01L 21/3083 257/E21.233 |
| 2005/0054274 A1* | 3/2005 | Kajiyama | ........... | H01L 21/6715 257/E21.283 |
| 2009/0042368 A1* | 2/2009 | Sekiya | ................ | H01L 21/3065 438/460 |

FOREIGN PATENT DOCUMENTS

| | | | | |
|---|---|---|---|---|
| JP | 2005193286 A | | 7/2005 | |
| JP | 6961297 B2 * | 11/2021 | ............. H01L 21/56 |

* cited by examiner

*Primary Examiner* — Niki H Nguyen
(74) *Attorney, Agent, or Firm* — Greer Burns & Crain Ltd.

(57) ABSTRACT

A method of processing a workpiece includes a holding step, a height position detecting step, a modified layer forming step, and a dividing step. The height position detecting step is a step of, after the holding step, applying a measuring laser beam emitted from a height position detecting unit to the workpiece while moving a chuck table that holds the workpiece thereon and the height position detecting unit relatively to each other to detect a height position of the workpiece using a reflected beam from a reverse side of the workpiece. In the height position detecting step, the measuring laser beam is applied clear of areas of the workpiece where columnar conductive electrodes are embedded in streets.

2 Claims, 11 Drawing Sheets

METHOD OF PROCESSING WORKPIECE

BACKGROUND OF THE INVENTION

Field of the Invention

The present invention relates to a method of processing a workpiece, and more particularly to a method of processing a workpiece having columnar conductive electrodes disposed in streets to divide the workpiece along projected dicing lines established respectively in the streets.

Description of the Related Art

In order to uniformize processing positions in heightwise directions where a workpiece is to be processed, there has been known a technology, i.e., a processing method, for detecting the height of the surface of the workpiece with a measuring laser beam applied to the workpiece and applying a processing laser beam to the workpiece on the basis of the detected height thereby to process the workpiece (see, for example, Japanese Patent Laid-Open No. 2005-193286).

SUMMARY OF THE INVENTION

According to the processing method disclosed in Japanese Patent Laid-Open No. 2005-193286, if metal exists in streets on the workpiece that demarcate the workpiece, then since areas of the streets where the metal exists and areas of the streets where no metal exists have different reflectances for the measuring laser beam, it is impossible to accurately measure the height of the surface of the workpiece along projected dicing lines established respectively in the streets. Therefore, the processing method disclosed in Japanese Patent Laid-Open No. 2005-193286 fails to process the workpiece at uniformized processing positions in heightwise directions.

It is therefore an object of the present invention to provide a method of processing a workpiece at uniformized processing positions in heightwise directions even in a case where the workpiece contains materials having different reflectances for a measuring laser beam in streets that demarcate the workpiece.

In accordance with an aspect of the present invention, there is provided a method of processing a workpiece having a plurality of devices disposed respectively in areas demarcated by a plurality of streets on a face side of the workpiece and including columnar conductive electrodes included in the streets and extending from the face side of the workpiece to a reverse side thereof, to divide the workpiece along projected dicing lines established respectively in the streets, including the steps of: holding the face side of the workpiece on a chuck table; thereafter, applying a measuring laser beam emitted from a height position detecting unit to the workpiece while moving the chuck table and the height position detecting unit relatively to each other to detect a height position of the workpiece using a reflected beam from the reverse side of the workpiece; positioning a focused spot of a processing laser beam emitted from a laser beam applying unit and having a wavelength transmittable through the workpiece within the workpiece on the basis of the detected height position, and applying the processing laser beam to the workpiece along the projected dicing lines while moving the chuck table and the laser beam applying unit relatively to each other to form modified layers in the workpiece; and exerting external forces on the formed modified layers to divide the workpiece, in which the step of applying the measuring laser beam includes a step of applying the measuring laser beam clear of areas of the workpiece where the columnar conductive electrodes are embedded in the streets.

Preferably, the method of processing a workpiece further includes a step of sticking a tape to the reverse side of the workpiece, in which the step of applying the processing laser beam includes a step of applying the processing laser beam through the tape stuck to the reverse side of the workpiece to the workpiece along the projected dicing lines while moving the chuck table and the laser beam applying unit to form the modified layers in the workpiece.

The method of processing a workpiece according to the present invention is advantageous in that processing positions in the workpiece in heightwise directions are uniformized even in the case where a material having a different reflectance is present in the streets.

The above and other objects, features and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

Preferred embodiments according to the present invention will be described in detail below with reference to the drawings. The present invention is not limited to the details of the embodiments described below. The components described below cover those which could easily be envisaged by those skilled in the art and those which are essentially identical to those described above. Furthermore, the arrangements described below can be used in appropriate combinations. Various omissions, replacements, or changes of the arrangements may be made without departing from the scope of the present invention.

First Embodiment

Figure 1:
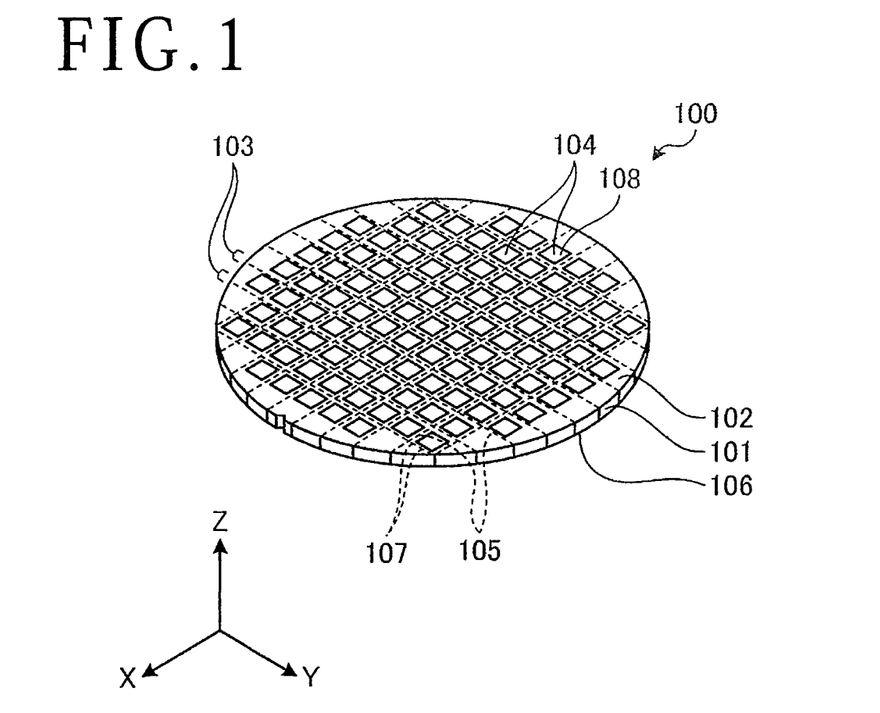
FIG. 1 is a perspective view illustrating by way of example a workpiece to be processed by a method of processing a workpiece according to a first embodiment of the present invention.
Figure 2:
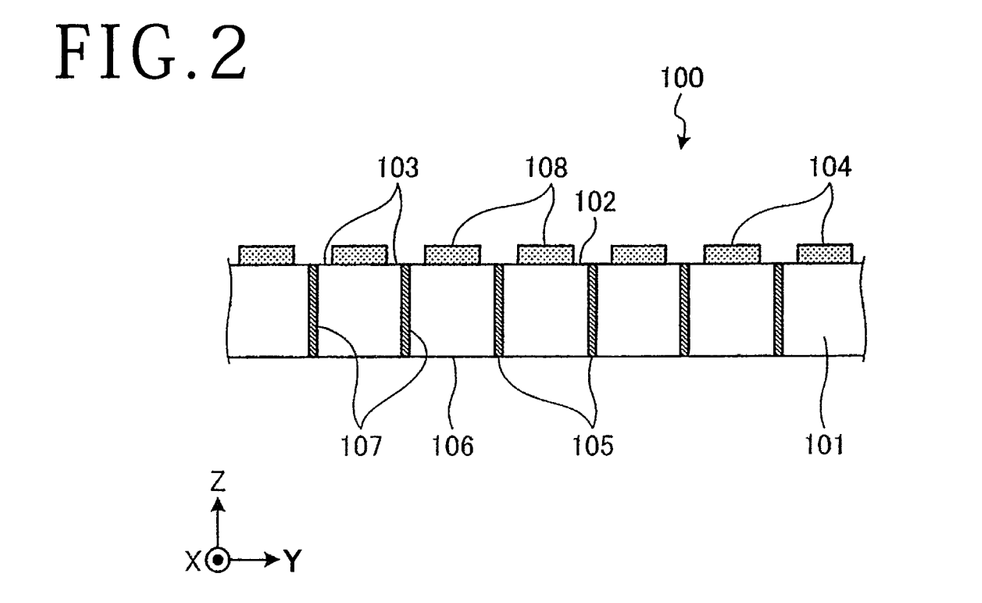
FIG. 2 is an enlarged fragmentary cross-sectional view of the workpiece illustrated in FIG. 1.

A method of processing a workpiece according to a first embodiment of the present invention will be described below with reference to the drawings. FIG. 1 is a perspective view illustrating by way of example a workpiece to be processed by the method of processing a workpiece according to the first embodiment. FIG. 2 is an enlarged fragmentary cross-sectional view of the workpiece illustrated in FIG. 1.

The method of processing a workpiece according to the first embodiment will be described as a method of processing a workpiece 100 illustrated in FIGS. 1 and 2. As illustrated in FIGS. 1 and 2, the workpiece 100 is a disk-shaped semiconductor wafer or optical device wafer having a substrate 101 made of silicon, sapphire, gallium, or the like. The workpiece 100 has a plurality of devices 104 disposed in respective areas demarcated in a grid pattern by a plurality of streets 103 on a face side 102 of the substrate 101. The workpiece 100 will be divided along projected dicing lines 105 established along the respective streets 103 into individual devices 104. According to the present embodiment, the projected dicing lines 105 are established centrally widthwise in the respective streets 103.

The workpiece 100 includes a plurality of columnar conductive electrodes 107 extending therethrough from the face side 102 to a reverse side 106 thereof and disposed on the projected dicing lines 105. The columnar conductive electrodes 107 are made of a metal material having a light reflectance different from the light reflectance of the material of the substrate 101. According to the present embodiment, the light reflectance of the metal material of the columnar conductive electrodes 107 is larger than the light reflectance of the material of the substrate 101. However, the present invention is not limited to such a reflectance relationship, but the light reflectance of the metal material of the columnar conductive electrodes 107 may be smaller than the light reflectance of the material of the substrate 101.

According to the first embodiment, the workpiece 100 should preferably a silicon wafer in which the substrate 101 has a thickness of approximately 750 μm, each of the streets 103 has a line width of approximately 80 μm, each of the devices 104 has a size of approximately 10 mm×5 mm, and each of through holes defined through the substrate 101 that are filled respectively with the columnar conductive electrodes 107 has a via hole diameter of approximately 20 μm. The substrate 101 of the workpiece 100 is not limited to any materials other than the metal material of the columnar conductive electrodes 107, and may be made of ceramics, resin, metal other than the metal material of the columnar conductive electrodes 107, or the like. The substrate 101 of the workpiece 100 is not limited to any shapes, any structures, and any sizes, etc. The devices 104 are not limited to any types, any quantities, any shapes, any structures, any sizes, and any layouts, etc. The columnar conductive electrodes 107 are not limited to any types of metal materials, any quantities, any shapes, any structures, any sizes, and any layouts, etc. The face side 102 of the substrate 101 of the workpiece 100 may be made of an insulative film of low dielectric constant, also referred to as a low-k film, as an interlayer insulative film serving as a function layer, and an alternately layered stack of the insulative film of low dielectric constant and an electrically conductive film that forms circuits may make up the devices 104.

Figure 3:
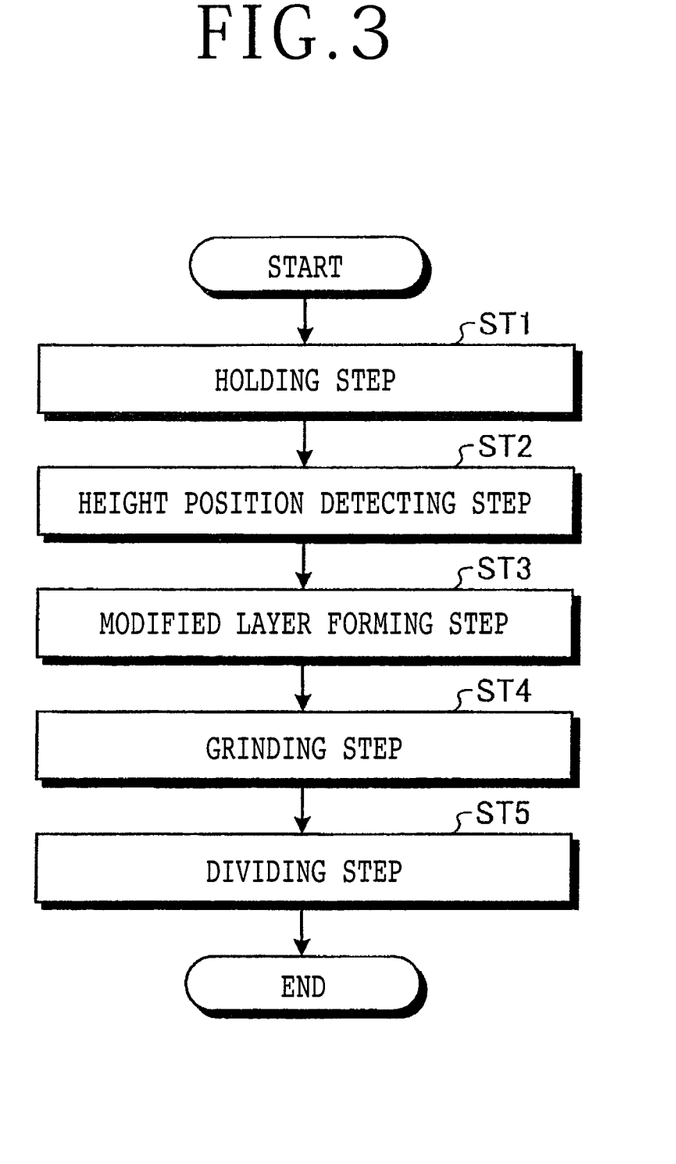
FIG. 3 is a flowchart of a sequence of the method of processing a workpiece according to the first embodiment.

FIG. 3 is a flowchart of a sequence of the method of processing a workpiece according to the first embodiment. As illustrated in FIG. 3, the method of processing a workpiece according to the first embodiment includes a holding step ST1, a height position detecting step ST2, a modified layer forming step ST3, a grinding step ST4, and a dividing step ST5.

(Holding Step)

Figure 4:
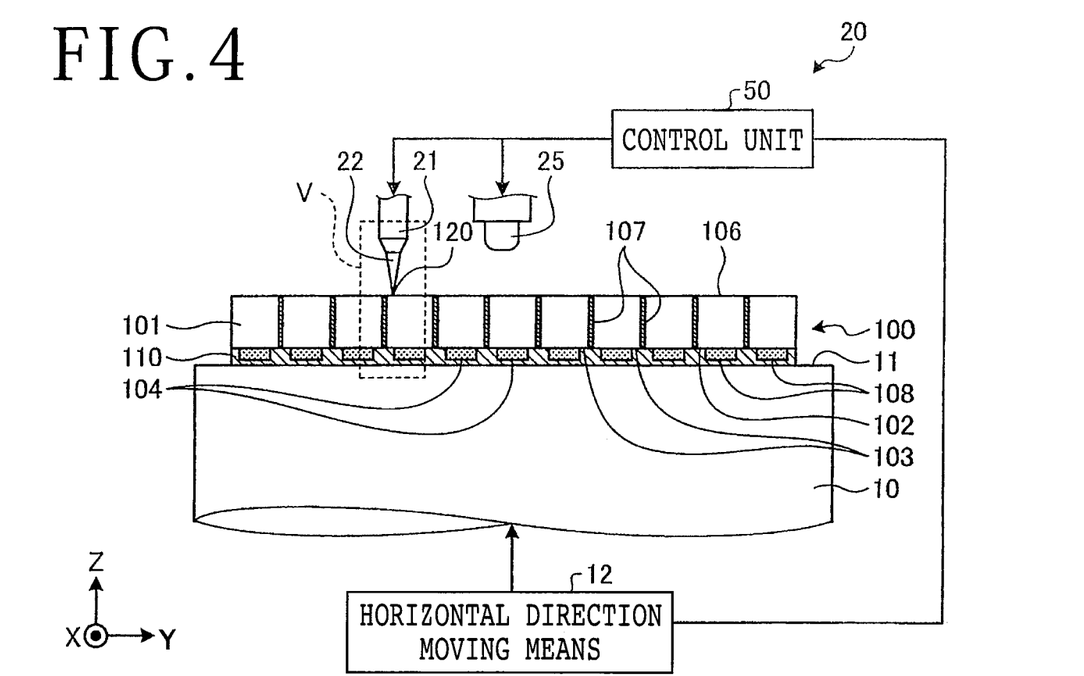
FIG. 4 is a cross-sectional view illustrating a height position detecting step of the method of processing a workpiece illustrated in FIG. 3.

The holding step ST1 is a step of holding the face side 102 of the workpiece 100 on a chuck table 10 (see FIG. 4). In the holding step ST1, a protective member 110 (see FIG. 4) is placed on the face side 102 of the workpiece 100, protecting the face side 102 of the workpiece 100 to make the face side 102 of the workpiece 100 holdable on the chuck table 10 with the protective member 110 interposed therebetween. In the holding step ST1, the protective member 110 may be an adhesive tape that can adhere to surfaces 108 of the devices 104 on the workpiece 100, a molded resin material that can cover the face side 102 of the workpiece 100, or the like.

In the holding step ST1, then, the face side 102 of the workpiece 100 on which the protective member 110 is placed is held on the chuck table 10 that belongs to a position detecting apparatus 20 (see FIG. 4) to be used in the height position detecting step ST2. In the holding step ST1, the workpiece 100 is placed on the chuck table 10 such that the protective member 110 faces a holding surface 11 of the chuck table 10, and a suction source, not illustrated, connected to the holding surface 11 of the chuck table 10 is actuated to apply a negative pressure to the protective member 110, thereby holding the workpiece 100 under suction on the holding surface 11 of the chuck table 10.

(Height Position Detecting Step)

Figure 5:
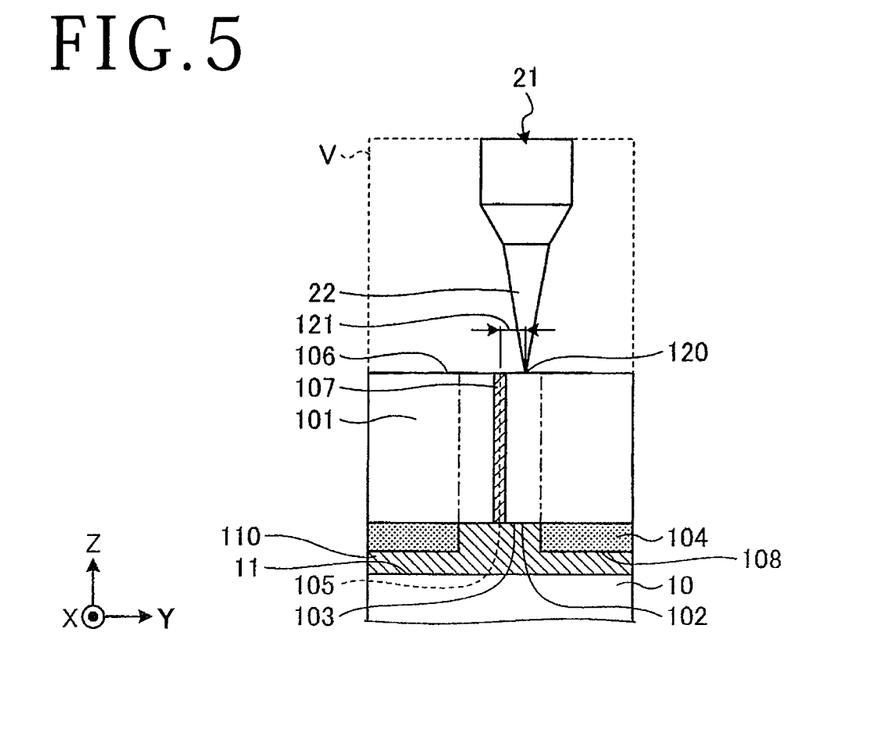
FIG. 5 is an enlarged view of a region V illustrated in FIG. 4.

FIG. 4 is a cross-sectional view illustrating the height position detecting step ST2 of the method of processing a workpiece illustrated in FIG. 3. FIG. 5 is an enlarged view of a region V illustrated in FIG. 4. As illustrated in FIGS. 4 and 5, the height position detecting step ST2 is a step of, after the holding step ST1, applying a measuring laser beam 22 to the workpiece 100 on the chuck table 10 while moving the chuck table 10 and a height position detecting unit 21 relatively to each other, and detecting the height position of the workpiece 100 with a reflected beam from the reverse side 106 of the workpiece 100. In the height position detecting step ST2, the measuring laser beam 22 is applied to the workpiece 100 except areas where the columnar conductive electrodes 107 are embedded in the workpiece 100 along the streets 103.

As illustrated in FIG. 4, the position detecting apparatus 20 used in the height position detecting step ST2 includes the chuck table 10 for holding the workpiece 100 on the holding surface 11, the height position detecting unit 21, image capturing means 25, and a control unit 50 for controlling various components of the position detecting apparatus 20. The chuck table 10 includes horizontal direction moving means 12 that can move the chuck table 10 in X-axis directions and Y-axis directions, i.e., horizontal directions. The height position detecting unit 21 includes, for example, a measuring laser beam source, an optical system, and a photodetector, all not illustrated. The height position detecting unit 21 is movable in Z-axis directions, i.e., vertical directions, by vertical direction moving means, not illustrated. The vertical direction moving means can thus adjust the height position of a focused spot of the measuring laser beam 22 that is emitted from the measuring laser beam source.

The measuring laser beam source of the height position detecting unit 21 applies the measuring laser beam 22 through the optical system to the workpiece 100 as illustrated in FIGS. 4 and 5. The measuring laser beam is reflectable from the reverse side 106 of the workpiece 100. The optical system adjusts the diameter of the focused spot of the measuring laser beam 22 in a range of approximately 10 to 50 μm. The photodetector of the height position detecting unit 21 detects a reflected beam from the reverse side 106 of the workpiece 100. The control unit 50 detects the height position of the reverse side 106 of the workpiece 100 on the basis of a period of time spend after the height position detecting unit 21 has applied the measuring laser beam 22 until it detects the reflected beam.

The image capturing means 25 captures an image of the face side 102 of the workpiece 100 held on the chuck table 10. The image capturing means 25 is an infrared camera, for example, although it is not limited to the infrared camera, but may be any of other image capturing apparatus. The image capturing means 25 is movable with respect to the workpiece 100 held on the chuck table 10 in the Z-axis directions in unison with the height position detecting unit 21 by the vertical direction moving means, not illustrated. The image capturing means 25 acquires an image of the face side 102 of the workpiece 100 to be used in an alignment process for positionally aligning the workpiece 100 held on the chuck table 10 and the height position detecting unit 21 with each other, and outputs the acquired image to the control unit 50. The image of the face side 102 of the workpiece 100 that is acquired by the image capturing means 25 includes information regarding the positions of the columnar conductive electrodes 107 embedded in the workpiece 100.

The control unit 50 controls the components of various apparatus, including the position detecting apparatus 20, used in the method of processing a workpiece according to the present embodiment to enable the components to operate to perform the method of processing a workpiece according to the present embodiment. The control unit 50 includes a computer system. The control unit 50 has an arithmetic processing apparatus having a microprocessor such as a central processing unit (CPU), a storage apparatus having a memory such as a read only memory (ROM) or a random access memory (RAM), and an input/output interface apparatus. The arithmetic processing unit of the control unit 50 performs arithmetic processing sequences according to computer programs stored in the storage unit, and outputs control signals for controlling the various apparatus to the various components described thereof through the input/output interface unit. The control unit 50 is connected to display means, not illustrated, such as a liquid crystal display unit for displaying states of operation with respect to the method of processing a workpiece according to the present embodiment and also displaying images, etc. The control unit 50 is also connected to input means used by the operator for registering information regarding operation with respect to the method of processing a workpiece according to the present embodiment. The input means includes at least one of a touch panel combined with the display means, a keyboard, and the like.

In the height position detecting step ST2, specifically, the control unit 50 controls the image capturing means 25 to capture an image of the workpiece 100, performs an alignment process for positionally aligning the workpiece 100 held on the chuck table 10 and the height position detecting unit 21 with each other on the basis of the captured image of the workpiece 100, and acquires information regarding the positions of the columnar conductive electrodes 107 embedded in the workpiece 100, from the captured image of the workpiece 100.

In the height position detecting step ST2, the control unit 50 then establishes position detecting lines 120, located clear of the areas where the columnar conductive electrodes 107 are embedded in the streets 103, as illustrated in FIGS. 4 and 5, respectively in association with the projected dicing lines 105, on the basis of the information acquired through the image capturing means 25 regarding the positions of the columnar conductive electrodes 107 embedded in the workpiece 100.

According to the present embodiment, in the height position detecting step ST2, the position detecting lines 120 are established along the directions in which the projected dicing lines 105 extend, clear of the areas where the columnar conductive electrodes 107 are embedded in the streets 103 in an in-plane direction perpendicular to the directions in which the projected dicing lines 105 extend. In the example illustrated in FIG. 4, in a case where height positions are to be detected along the projected dicing lines 105 extending along the X-axis directions, the position detecting lines 120 are established along the X-axis directions clear of the areas where the columnar conductive electrodes 107 are embedded in one of the Y-axis directions. In the height position detecting step ST2, according to the present embodiment, a shifted distance 121 by which the position detecting lines 120 are positioned clear of, i.e., are shifted from, the respective areas where the columnar conductive electrodes 107 are embedded is of a predetermined value that is larger than the sum of the via hole diameter of the columnar conductive electrodes 107 and the diameter of the focused spot of the measuring laser beam 22 and smaller than one half of the line width of the streets 103. However, the shifted distance 121 in the Y-axis directions is not limited to such a value, but may be of any values insofar as the measuring laser beam 22 is not adversely affected by reflections from the columnar conductive electrodes 107 and makes it possible to accurately measure the height position of the reverse side 106 of the workpiece 100.

According to the present embodiment, in the height position detecting step ST2, the position detecting lines 120 are represented by straight lines in the streets 103 that are translated from the projected dicing lines 105 by the shifted distance 121 in one of the Y-axis directions. However, according to the present invention, the position detecting liens 120 are not limited to such straight lines, but may be represented by polygonal or zigzag lines having only portions translated from the projected dicing lines 105 by the shifted distance 121 in order to stay clear of the areas where the columnar conductive electrodes 107 are embedded.

In the height position detecting step ST2, next, the control unit 50 controls the horizontal direction moving means 12 to move the chuck table 10 and the height position detecting unit 21 horizontally relatively to each other along the position detecting line 120 established in association with each of the projected dicing lines 105. In the example illustrated in FIG. 4, the horizontal direction moving means 12 moves the chuck table 10 and the height position detecting unit 21 horizontally relatively to each other in one of the X-axis directions along the position detecting lines 120 that extend in the X-axis directions. Concurrent with the relative movement of the chuck table 10 and the height detecting unit 21, the control unit 50 controls the height position detecting unit 21 to apply the measuring laser beam 22 to the workpiece 100 held on the chuck table 10 and detects the height position of the reverse side 106 of the workpiece 100 using a reflected beam from the reverse side 106 of the workpiece 100. In the height position detecting step ST2, therefore, the control unit 50 detects the height position of the reverse side 106 of the workpiece 100 along the position detecting line 120 established in association with each of the projected dicing lines 105.

In the height position detecting step ST2, then, the control unit 50 performs a process for regarding the height position of the reverse side 106 of the workpiece 100 detected along the position detecting line 120 established in association with each of the projected dicing lines 105, as the height position of the reverse side 106 of the workpiece 100 detected along each of the projected dicing lines 105, thereby acquiring information regarding the height position of the reverse side 106 of the workpiece 100 detected along each of the projected dicing lines 105.

(Modified Layer Forming Step)

Figure 6:
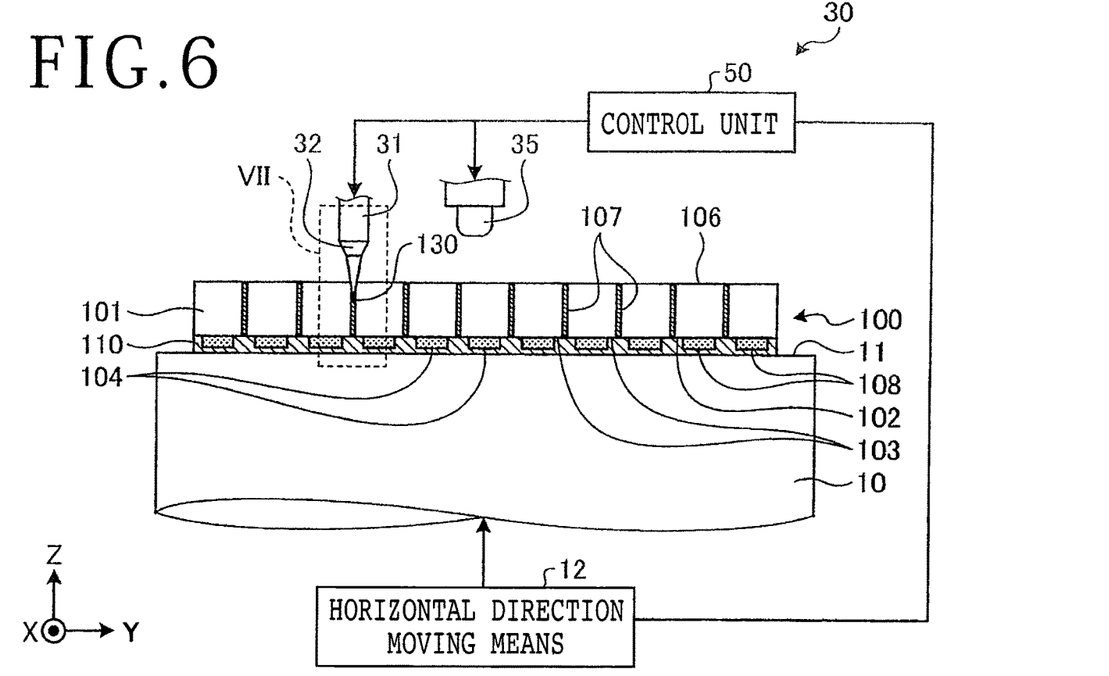
FIG. 6 is a cross-sectional view illustrating a modified layer forming step of the method of processing a workpiece illustrated in FIG. 3.
Figure 7:
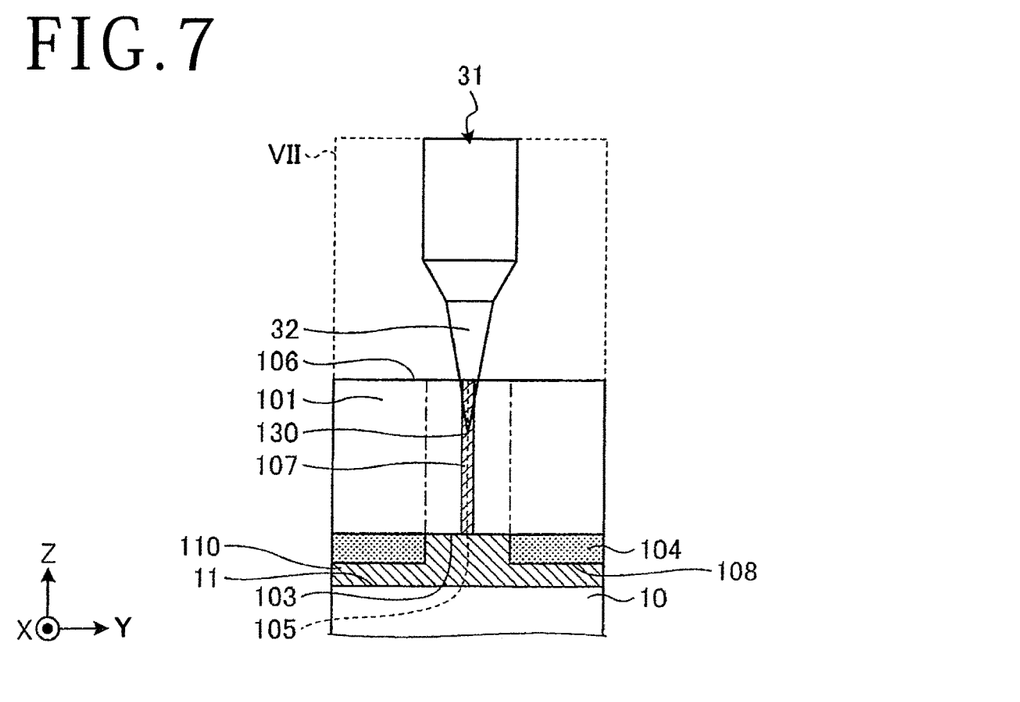
FIG. 7 is an enlarged view of a region VII illustrated in FIG. 6.

FIG. 6 is a cross-sectional view illustrating the modified layer forming step ST3 of the method of processing a workpiece illustrated in FIG. 3. FIG. 7 is an enlarged view of a region VII illustrated in FIG. 6. As illustrated in FIGS. 6 and 7, the modified layer forming step ST3 is a step of positioning a focused spot 130 of a processing laser beam 32 having a wavelength transmittable through the workpiece 100, within the workpiece 100 on the basis of the height position detected in the height position detecting step ST2, and applying the processing laser beam 32 to the workpiece 100 along the projected dicing lines 105 while moving the chuck table 10 and a laser beam applying unit 31 relatively to each other, thereby forming modified layers 140 (see FIG. 8) in the workpiece 100.

As illustrated in FIG. 6, a modified layer forming apparatus 30 used in the modified layer forming step ST3 includes a chuck table 10 for holding the workpiece 100 on a holding surface 11 thereof, horizontal direction moving means 12, the laser beam applying unit 31, image capturing means 35, and a control unit 50 for controlling the various components thereof. The chuck table 10, the horizontal direction moving means 12, and the control unit 50 are identical to those of the position detecting apparatus 20, and are denoted by the identical reference characters and will not be described in detail below. The laser beam applying unit 31 includes a processing laser beam source and an optical system, for example, both not illustrated. The laser beam applying unit 31 is movable in the Z-axis directions, i.e., the vertical directions, by vertical direction moving means, not illustrated. The vertical direction moving means can thus adjust the height position of the focused spot 130 of the processing laser beam 32 that is emitted from the processing laser beam source.

The laser beam applying unit 31 applies the processing laser beam 32, emitted from the processing laser beam source, whose wavelength is transmittable through the workpiece 100, through the optical system to the workpiece 100, as illustrated in FIGS. 6 and 7. The optical system of the laser beam applying unit 31 converges the processing laser beam 32 into the focused spot 130 in the workpiece 100 and adjusts the diameter of the focused spot 130 in a range of approximately 10 to 50 µm. According to the present embodiment, the laser beam applying unit 31 is controlled by the control unit 50 to emit a pulsed laser beam having a repetitive frequency of approximately 60 kHz and an average output power level ranging from approximately 0.8 to 1.2 W, as the processing laser beam 32.

The image capturing means 35 captures an image of the workpiece 100 held on the chuck table 10. The image capturing means 35 is movable in unison with the laser beam applying unit 31 in the Z-axis directions, i.e., the vertical directions, with respect to the workpiece 100 held on the chuck table 10 by vertical direction moving means, not illustrated. The image capturing means 35 acquires an image of the workpiece 100 to be used in an alignment process for positionally aligning the workpiece 100 held on the chuck table 10 and the laser beam applying unit 31, and outputs the acquired image to the control unit 50. The image of the face side 102 of the workpiece 100 that is acquired by the image capturing means 35 includes information regarding the positions of the columnar conductive electrodes 107 embedded in the workpiece 100.

According to the present embodiment, the height position detecting unit 21 of the position detecting apparatus 20 and the laser beam applying unit 31 of the modified layer forming apparatus 30 are separate units. However, the present invention is not limited to such details. Instead of these separate units, there may be employed a unitary laser beam applying unit that includes both a measuring laser beam source and a processing laser beam source. In a case where such a unitary laser beam applying unit that includes both a measuring laser beam source and a processing laser beam source is employed, common image capturing means is used as the image capturing means 25 of the position detecting apparatus 20 and the image capturing means 35 of the modified layer forming apparatus 30.

In the modified layer forming step ST3, specifically, the control unit 50 controls the image capturing means 35 to capture an image of the workpiece 100 and performs an alignment process for positionally aligning the workpiece 100 held on the chuck table 10 and the laser beam applying unit 31 with each other on the basis of the captured image of the workpiece 100.

In the modified layer forming step ST3, next, the control unit 50 keeps the focused spot 130 of the processing laser beam 32 at a predetermined depth in the workpiece 100 with the vertical direction moving means, not illustrated, on the basis of information regarding the height position of the reverse side 106 of the workpiece 100 detected in the height position detecting step ST2 with respect to each of the projected dicing lines 105, while at the same time controlling the horizontal direction moving means 12 to move the chuck table 10 for thereby moving the applied position of the pulsed processing laser beam 32 in one of the X-axis directions along each of the projected dicing lines 105.

In the modified layer forming step ST3, then, the control unit 50 positions the focused spot 130 of the processing laser beam 32 successively at a first predetermined depth, a second predetermined depth, and a third predetermined depth in the workpiece 100 along all the projected dicing lines 105 on the workpiece 100, while at the same time applying the processing laser beam 32 to the workpiece 100 successively three times to form modified layers 140 (see FIG. 8) in the workpiece 100. The number of times that the processing laser beam 32 is applied in the modified layer forming step ST3 is not limited to three in the present embodiment, but may be changed depending on the thickness of the workpiece 100 and the conditions in which the processing laser beam 32 is applied, etc.

In the modified layer forming layer ST3, the modified layers 140 are formed along the projected dicing lines 105, not along the position detecting lines 120 established in the height position detecting step ST2, across the areas where the columnar conductive electrodes 107 are formed on the projected dicing lines 105.

(Grinding Step)

Figure 8:
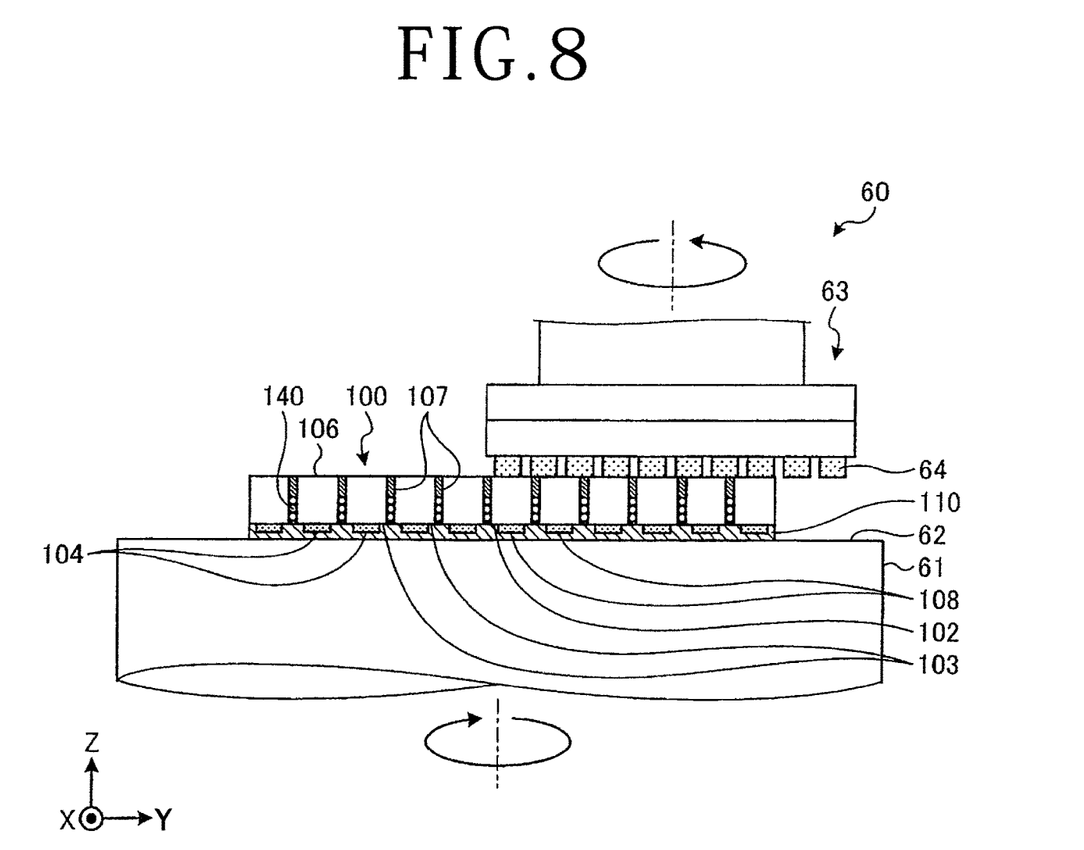
FIG. 8 is a cross-sectional view illustrating a grinding step of the method of processing a workpiece illustrated in FIG. 3.

FIG. 8 is a cross-sectional view illustrating the grinding step ST4 of the method of processing a workpiece illustrated in FIG. 3. As illustrated in FIG. 8, the grinding step ST4 is a step of grinding the reverse side 106 of the workpiece 100 to remove portions of the reverse side 106 of the workpiece 100 that are free of the modified layers 140. According to the present embodiment, a stealth dicing before grinding (SDBG) process is employed in the method of processing a workpiece. Therefore, the grinding step ST4 is carried out after the modified layers 140 are formed in the modified layer forming step ST3 and before the workpiece 100 is divided in the dividing step ST5.

As illustrated in FIG. 8, a grinding apparatus 60 used in the grinding step ST4 includes a chuck table 61 for holding the workpiece 100 under suction on a holding surface 62 thereof, a grinding unit 63 with grinding stones 64 mounted thereon, and a control unit, not illustrated, for controlling various components of the grinding apparatus 60.

In the grinding step ST4, specifically, the grinding apparatus 60 operates to hold the face side 102 of the workpiece 100 with the modified layers 140 formed therein under suction on the holding surface 62 of the chuck table 61 with the protective member 110 interposed therebetween. In the grinding step ST4, then, while the grinding stones 64 are being rotated by the grinding unit 63 and the chuck table 61 is being rotated about its vertical central axis, a grinding fluid is supplied onto the reverse side 106 of the workpiece 100 and the grinding stones 64 are fed toward the chuck table 61 at a predetermined feed speed, thereby grinding the reverse side 106 of the workpiece 100 with the grinding stones 64. The grinding step ST4 is carried out in two stages. In the former stage, rough grinding stones 64 having larger abrasive grains are used to perform rough-grinding on the reverse side 106 of the workpiece 100. In the latter stage, finishing grinding stones 64 having smaller abrasive grains, which are smaller than the larger abrasive grains of the rough grinding stones 64, are used to perform finishing-grinding on the reverse side 106 of the workpiece 100.

(Dividing Step)

Figure 9:
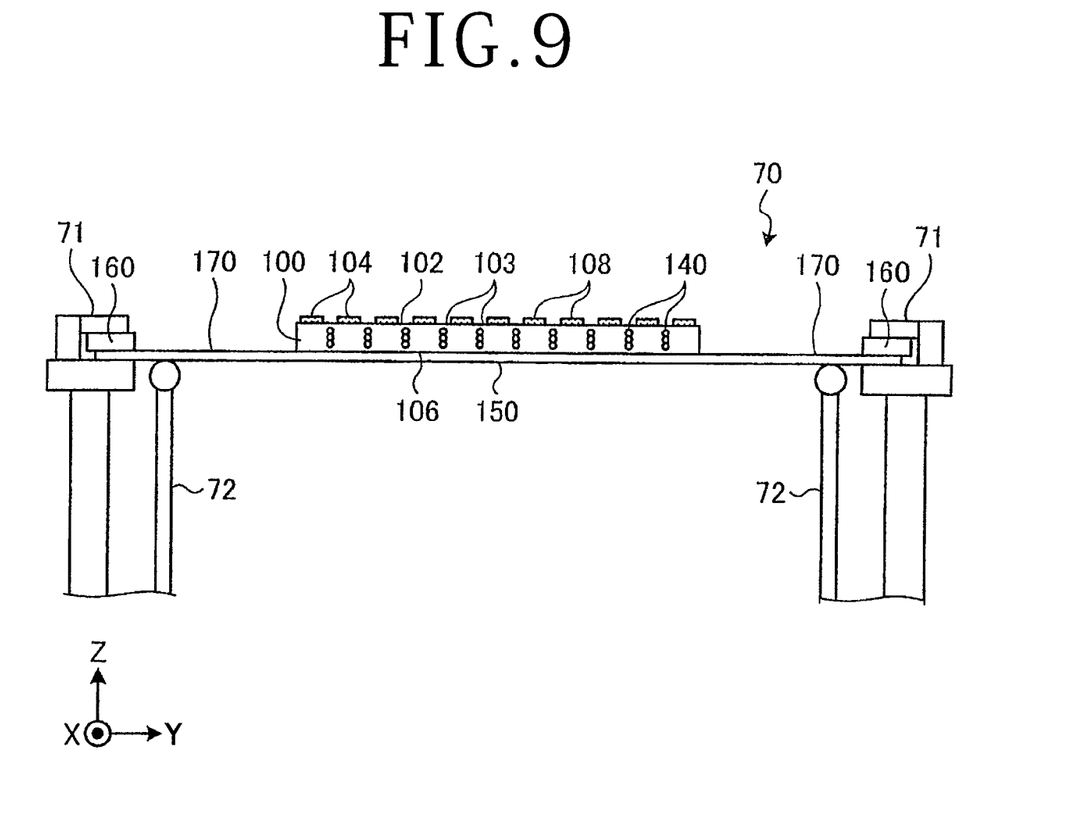
FIG. 9 is a cross-sectional view illustrating the workpiece before it is divided in a dividing step of the method of processing a workpiece illustrated in FIG. 3.
Figure 10:
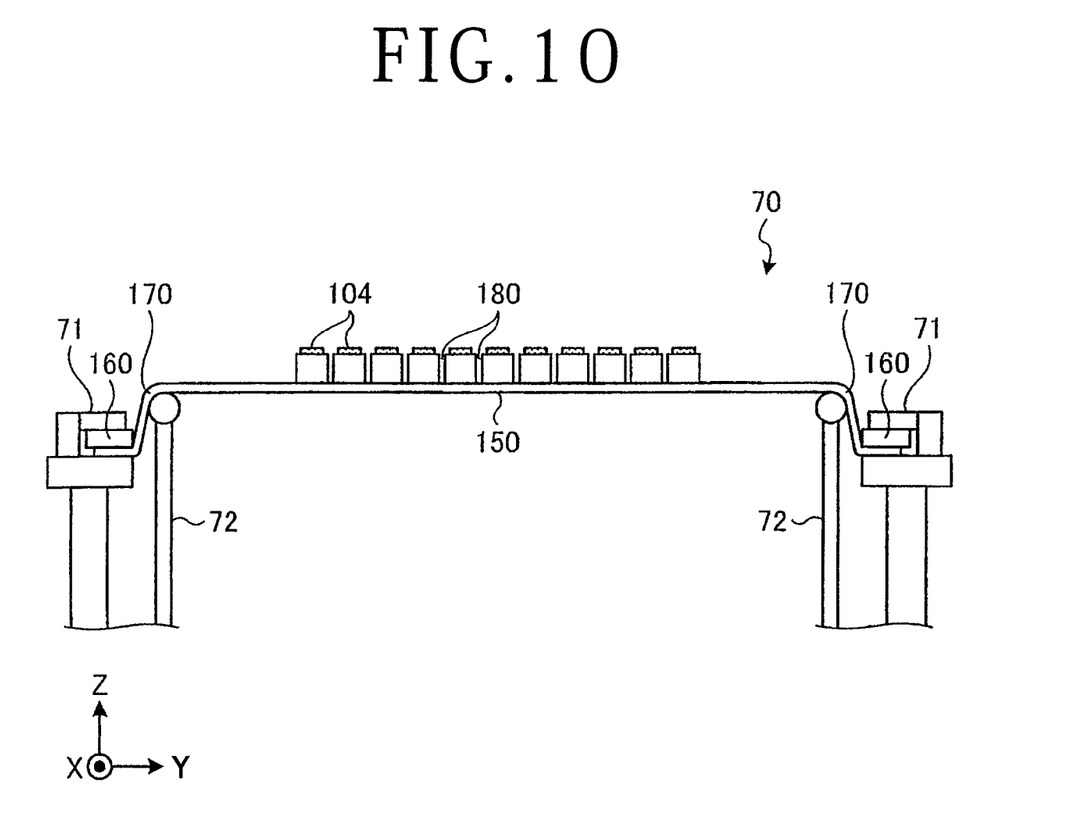
FIG. 10 is a cross-sectional view illustrating the workpiece after it is divided in the dividing step of the method of processing a workpiece illustrated in FIG. 3.

FIG. 9 is a cross-sectional view illustrating the workpiece 100 before it is divided in the dividing step ST5 of the method of processing a workpiece illustrated in FIG. 3. FIG. 10 is a cross-sectional view illustrating the workpiece 100 after it is divided in the dividing step ST5 of the method of processing a workpiece illustrated in FIG. 3. As illustrated in FIGS. 9 and 10, the dividing step ST5 is a step of exerting external forces on the modified layers 140 formed in the modified layer forming step ST3 to divide the workpiece 100 along the projected dicing lines 105.

As illustrated in FIGS. 9 and 10, a dividing apparatus 70 used in the dividing step ST5 is an apparatus for expanding or stretching an expandable sheet 150 stuck to the reverse side 106 of the workpiece 100 to divide the workpiece 100 with the modified layers 140 formed therein along the projected dicing lines 105 into individual devices 104. The expandable sheet 150 is elastically stretchable and includes a base material layer made of synthetic resin and an adhesive layer stacked on the base material layer for sticking to the reverse side 106 of the workpiece 100 and an annular frame 160. As illustrated in FIGS. 9 and 10, the dividing apparatus 70 includes a frame fixing unit 71 that fixes in position the annular frame 160 to which an outer circumferential area of the expandable sheet 150 is stuck, a sheet expanding unit 72 for expanding or stretching the expandable sheet 150, and a control unit, not illustrated, for controlling various components of the dividing apparatus 70.

The frame fixing unit 71 is of a substantially circular shape as viewed in plan, and fixes the annular frame 160 in position by gripping the full circumferential edge of the annular frame 160 from an outer circumferential side thereof. The frame fixing unit 71 has a substantially circular hole as viewed in plan, defined therein.

The sheet expanding unit 72 is of a circular planar shape coaxial with the frame fixing unit 71, and is disposed radially inwardly of the frame fixing unit 71. When the sheet expanding unit 72 is moved upwardly along a vertical axis with respect to the frame fixing unit 71, the sheet expanding unit 72 presses an annular area 170 of the expandable sheet 150 that lies between an inner circumferential edge of the annular frame 160 and an outer circumferential edge of the workpiece 100 in an upward direction perpendicular to the reverse side 106 of the workpiece 100, expanding or stretching the expandable sheet 150 radially outwardly. The expansion of the expandable sheet 150 exerts external forces on the modified layers 140, breaking the workpiece 100 from the modified layers 140 that act as division initiating points.

In the dividing step ST5, the expandable sheet 150 with the annular frame 160 stuck to the outer circumferential area thereof is stuck to the reverse side 106 of the workpiece 100. In the dividing step ST5, then, the protective member 110 is removed from the face side 102 of the workpiece 100, thereby making the dividing apparatus 70 ready to perform a dividing process for dividing the workpiece 100 into individual devices 104 along the projected dicing lines 105.

In the dividing step ST5, next, as illustrated in FIG. 9, the frame fixing unit 71 grips and fixes in position the annular frame 160 stuck to the expandable sheet 150 to which the reverse side 106 of the workpiece 100 is also stuck. In the dividing step ST5, thereafter, the dividing apparatus 70 operates to move the sheet expanding unit 72 upwardly along the vertical axis relatively to the frame fixing unit 71, as illustrated in FIG. 10. The annular area 170 is now pressed upwardly in the direction perpendicular to the reverse side 106 of the workpiece 100, thereby expanding or stretching the expandable sheet 150 radially outwardly. When the expandable sheet 150 is expanded, it exerts external forces on the modified layers 140, dividing the workpiece 100 into individual devices 104 along the projected dicing lines 105 from the modified layers 140 acting as the division initiating points, with gaps 180 created between the devices 104.

The method of processing a workpiece according to the first embodiment includes, as described above, the height position detecting step ST2 in which the measuring laser beam 22 is applied to the workpiece 100 along the position detecting lines 120 located clear of the areas where the columnar conductive electrodes 107 are embedded in the streets 103, to detect the height position of the reverse side 106 of the workpiece 100, and the detected height position along the position detecting lines 120 is regarded as the height position of the reverse side 106 of the workpiece 100 along the projected dicing lines 105. The method of processing a workpiece according to the first embodiment also includes the modified layer forming step ST3 in which the modified layers 140 are formed in the workpiece 100 along the projected dicing lines 105 on the basis of the height position of the reverse side 106 of the workpiece 100 along the projected dicing lines 105. Therefore, even in a case where the columnar conductive electrodes 107 that are of a material having a different reflectance are present in the streets 103, the method of processing a workpiece according to the first embodiment is able to reduce or remove adverse effects imposed by the material having the different reflectance in detecting the height position of the reverse side 106 of the workpiece 100. Consequently, the method of processing a workpiece according to the first embodiment can uniformize processing positions in the heightwise directions that are represented, for example, by the depths at which the modified layers 140 are formed on the basis of the detected height position. Furthermore, the method of processing a workpiece according to the first embodiment is effective to greatly reduce the possibility that each of the devices 104 will suffer cracking or chipping as the workpiece 100 is divided into the devices 104 from the modified layers 140 formed at the uniformized depths as division initiating points in the dividing step ST5.

Second Embodiment

Figure 11:
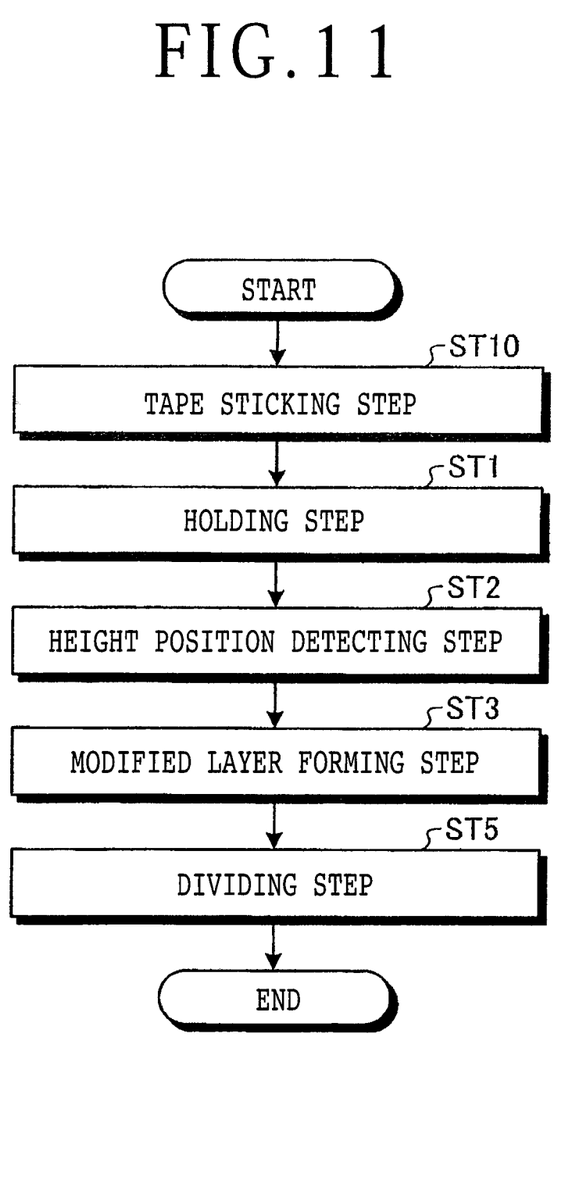
FIG. 11 is a flowchart of a sequence of a method of processing a workpiece according to a second embodiment of the present invention.

A method of processing a workpiece according to a second embodiment of the present invention will be described below with reference to the drawings. Those parts of the second embodiment that are identical to those of the first embodiment are denoted by identical reference characters, and their description will be omitted below. FIG. 11 is a flowchart of a sequence of the method of processing a workpiece according to the second embodiment. As illustrated in FIG. 11, the method of processing a workpiece according to the second embodiment includes a tape sticking step ST10, and accordingly the height position detecting step ST2, the modified layer forming step ST3, and the dividing step ST5 are changed and the grinding step ST4 is omitted. Otherwise, the method of processing a workpiece according to the second embodiment is the same as the method of processing a workpiece according to the first embodiment.

Figure 12:
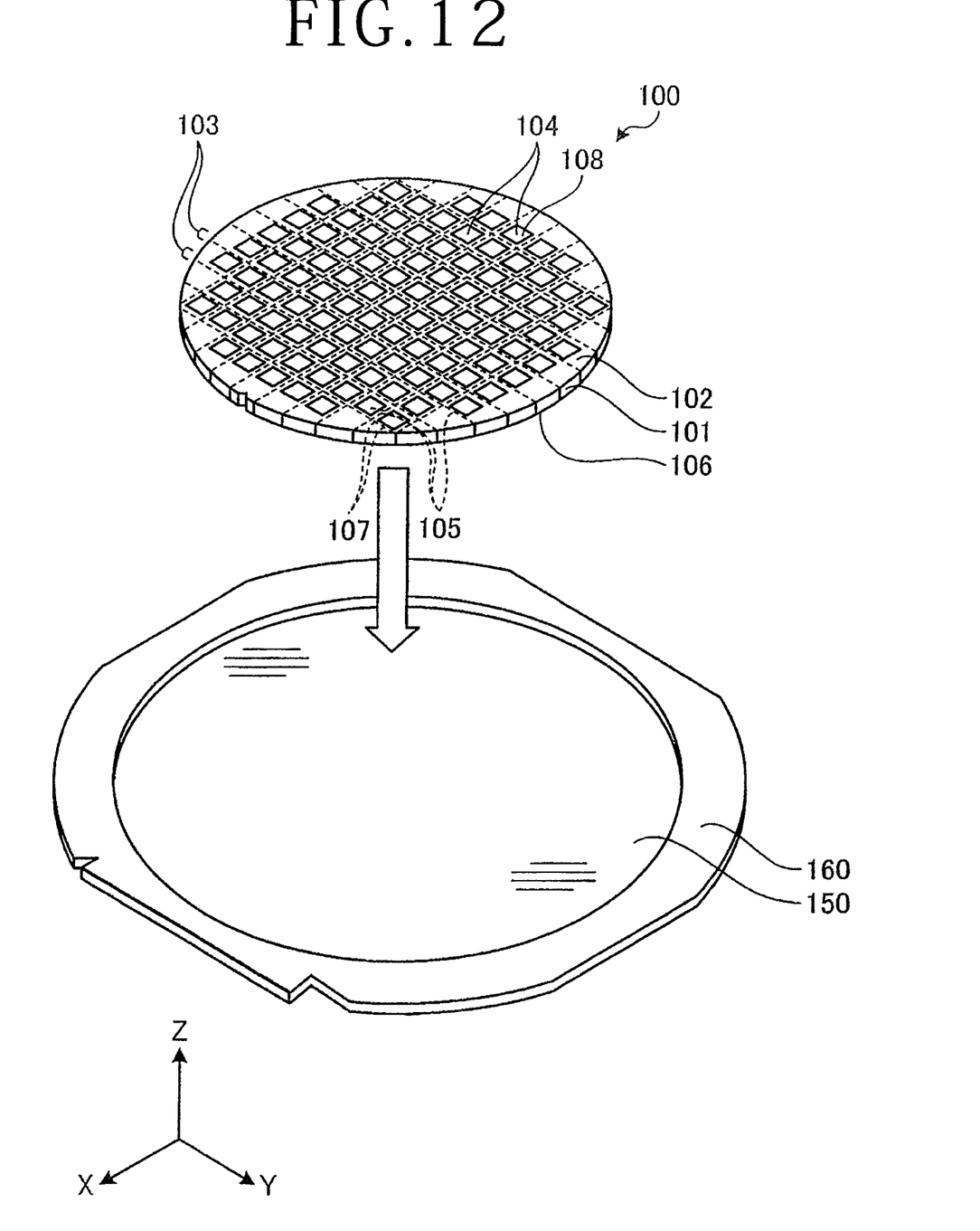
FIG. 12 is a perspective view illustrating a tape sticking step of the method of processing a workpiece illustrated in FIG. 11.

FIG. 12 is a perspective view illustrating the tape sticking step ST10 of the method of processing a workpiece illustrated in FIG. 11. The tape sticking step ST10 is a step of sticking a tape to the reverse side 106 of the workpiece 100 prior to the holding step ST1, as illustrated in FIG. 12. According to the present embodiment, in the tape sticking step ST10, the expandable sheet 150 with the annular frame 160 stuck to the outer circumferential area thereof is stuck to the reverse side 106 of the workpiece 100.

Figure 13:
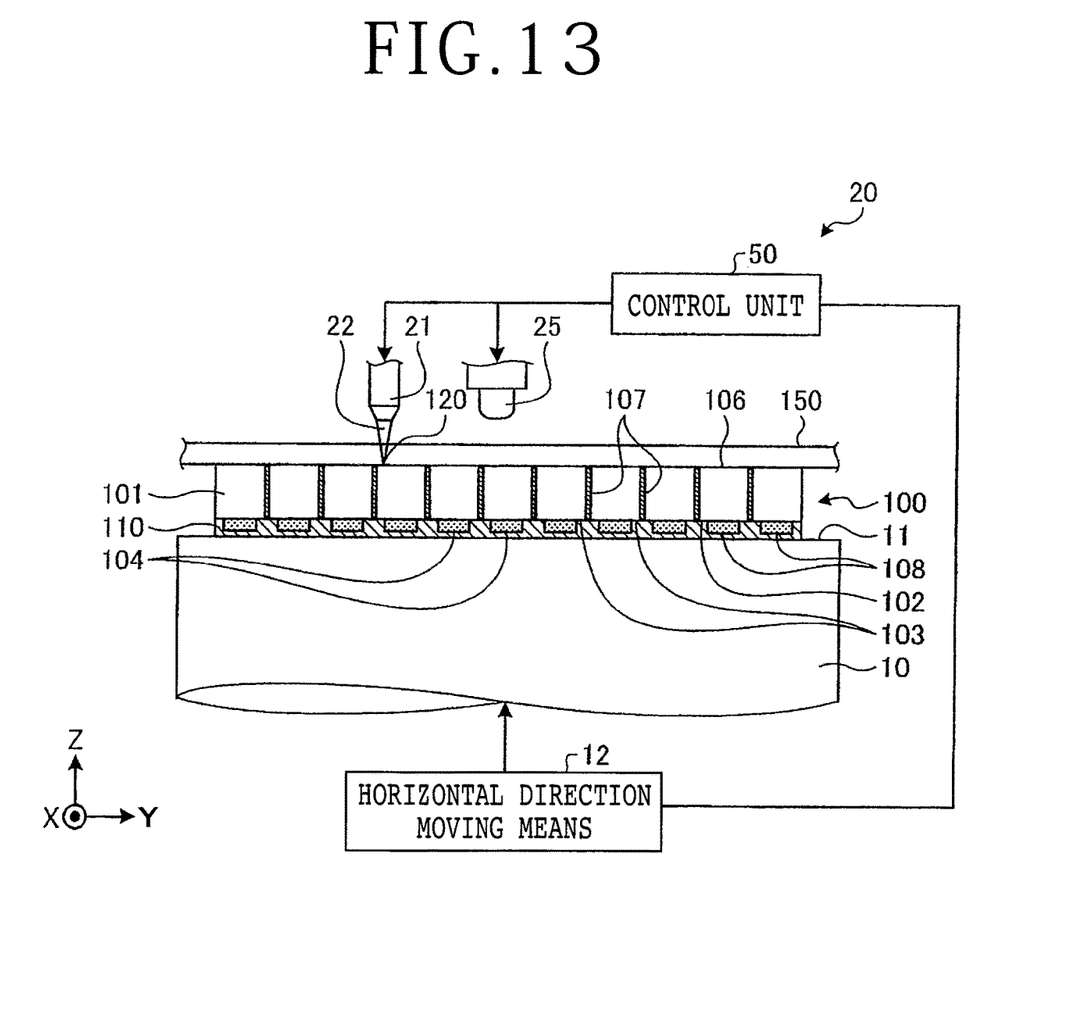
FIG. 13 is a cross-sectional view illustrating a height position detecting step of the method of processing a workpiece illustrated in FIG. 11.

FIG. 13 is a cross-sectional view illustrating a height position detecting step ST2 of the method of processing a workpiece illustrated in FIG. 11. In the height position detecting step ST2 according to the second embodiment, as illustrated in FIG. 13, a measuring laser beam 22 having a wavelength transmittable through the expandable sheet 150 is applied through the expandable sheet 150 to the reverse side 106 of the workpiece 100 to detect the height of the reverse side 106 of the workpiece 100. Otherwise, the height position detecting step ST2 according to the second embodiment is the same as the height position detecting step ST2 according to the first embodiment.

Figure 14:
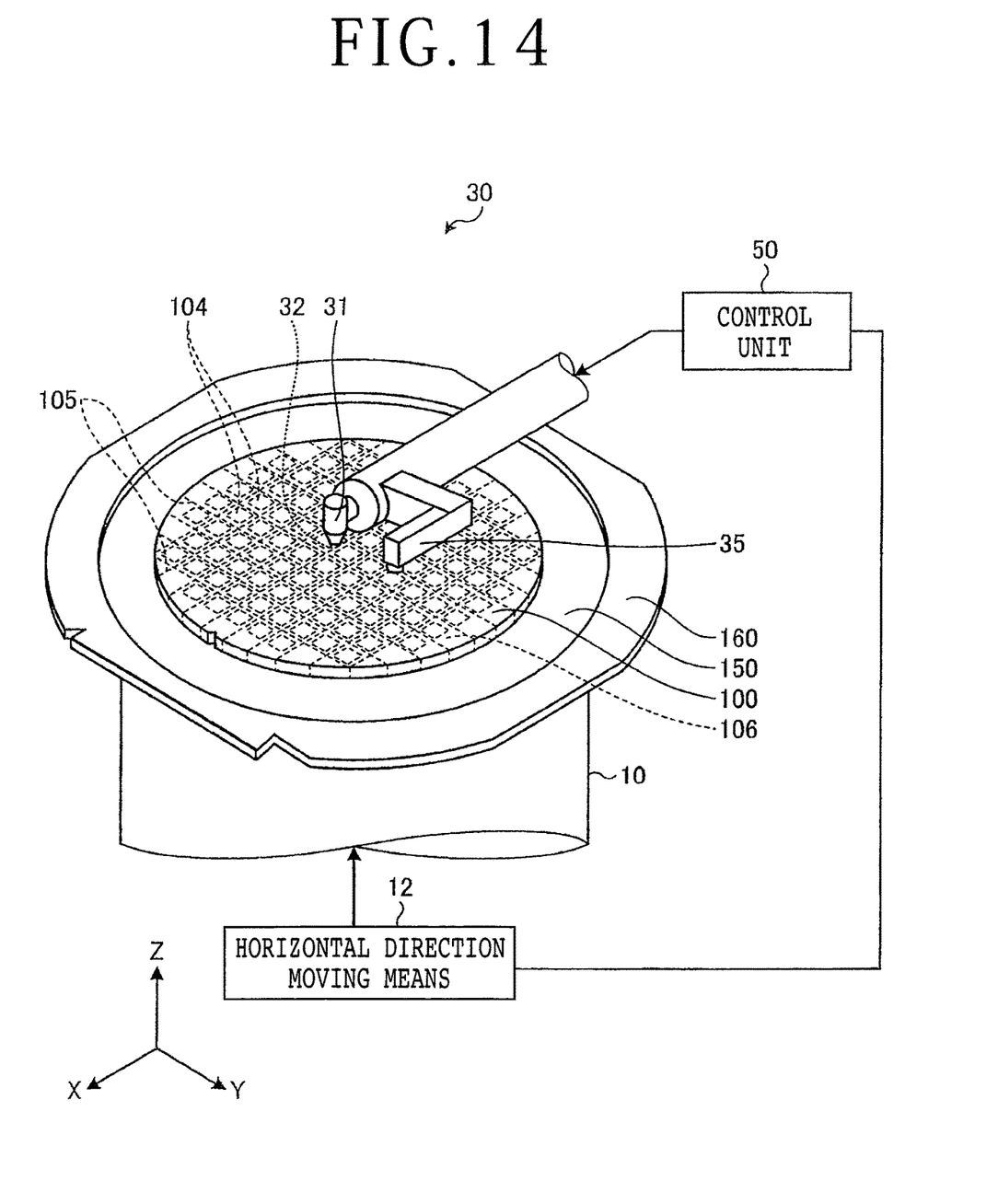
FIG. 14 is a perspective view illustrating a modified layer forming step of the method of processing a workpiece illustrated in FIG. 11.

FIG. 14 is a perspective view illustrating a modified layer forming step ST3 of the method of processing a workpiece illustrated in FIG. 11. In the modified layer forming step ST3 according to the second embodiment, as illustrated in FIG. 14, a processing laser beam 32 having a wavelength transmittable through the workpiece 100 is applied through the expandable sheet 150 to the workpiece 100 to form the modified layers 140 in the workpiece 100. Otherwise, the modified layer forming step ST3 according to the second embodiment is the same as the modified layer forming step ST3 according to the first embodiment.

In the dividing step ST5 according to the second embodiment, since the expandable sheet 150 has already been stuck to the workpiece 100 in the tape sticking step ST10, only the dividing process is performed by a dividing apparatus which is similar to the dividing apparatus 70 according to the first embodiment.

The method of processing a workpiece according to the second embodiment is arranged as described above, and operates in a similar manner and offers similar advantages to the method of processing a workpiece according to the first embodiment. The method of processing a workpiece according to the second embodiment further includes the tape sticking step ST10 of sticking a tape to the reverse side 106 of the workpiece 100. In the method of processing a workpiece according to the second embodiment, the processing laser beam 32 whose wavelength is transmittable through the workpiece 100 is applied through the tape to the workpiece 100 to form the modified layers 140 in the workpiece 100. Inasmuch as the reverse side 106 of the workpiece 100 is protected by the tape and the height position of the reverse side 106 of the workpiece 100 is detected without being adversely affected by thickness variations of the tape, etc., the method of processing a workpiece according to the second embodiment is able to uniformize the processing positions in the heightwise directions that are represented, for example, by the depths at which the modified layers 140 are formed.

The present invention is not limited to the embodiments described hereinbefore. Various changes and modifications may be made to the embodiments without departing from the scope of the present invention. For example, according to the first embodiment and the second embodiment described above, the position detecting apparatus 20 used in the height position detecting step ST2 and the modified layer forming apparatus 30 used in the modified layer forming step ST3 use the common chuck table 10, and the grinding apparatus 60 used in the grinding step ST4 uses the chuck table 61 that is different from the chuck table 10. However, the present invention is not limited to such details, but the position detecting apparatus 20, the modified layer forming apparatus 30, and the grinding apparatus 60 may use respective chuck tables different from each other or may use a common chuck table. Depending on the manner in which a chuck table is used, the holding step ST1 of holding the face side 102 of the workpiece 100 on the chuck table is appropriately changed.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of processing a workpiece having a plurality of devices disposed respectively in areas demarcated by a plurality of streets on a face side of the workpiece and including columnar conductive electrodes included in the streets and extending from the face side of the workpiece to a reverse side thereof, to divide the workpiece along projected dicing lines established respectively in the streets, comprising the steps of:

holding the face side of the workpiece on a chuck table;

thereafter, applying a measuring laser beam emitted from a height position detecting unit to the workpiece while moving the chuck table and the height position detecting unit relatively to each other to detect a height position of the workpiece using a reflected beam from the reverse side of the workpiece;

positioning a focused spot of a processing laser beam emitted from a laser beam applying unit and having a wavelength transmittable through the workpiece within the workpiece on a basis of the detected height position, and applying the processing laser beam to the workpiece along the projected dicing lines while moving the chuck table and the laser beam applying unit relatively to each other to form modified layers in the workpiece; and exerting external forces on the formed modified layers to divide the workpiece;

wherein the step of applying the measuring laser beam includes a step of applying the measuring laser beam away from areas of the workpiece where the columnar conductive electrodes are embedded in the streets.

2. The method of processing a workpiece according to claim 1, further comprising:

a step of sticking a tape to the reverse side of the workpiece;

wherein the step of applying the processing laser beam includes a step of applying the processing laser beam through the tape stuck to the reverse side of the workpiece to the workpiece along the projected dicing lines while moving the chuck table and the laser beam applying unit to form the modified layers in the workpiece.

* * * * *